United States Patent
Odawara

(10) Patent No.: US 6,552,537 B2
(45) Date of Patent: Apr. 22, 2003

(54) SUPERCONDUCTIVE QUANTUM INTERFERENCE ELEMENT

(75) Inventor: Akikazu Odawara, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/944,362

(22) Filed: Aug. 31, 2001

(65) Prior Publication Data

US 2002/0097047 A1 Jul. 25, 2002

(30) Foreign Application Priority Data

Sep. 13, 2000 (JP) ........................................ 2000-277914

(51) Int. Cl.[7] ................................................ G01R 33/02
(52) U.S. Cl. ........................................ 324/248; 505/846
(58) Field of Search ................................ 324/248, 244, 324/245, 246; 505/846, 845, 922; 257/31

(56) References Cited

U.S. PATENT DOCUMENTS 5,656,937 A * 8/1997 Cantor ........................ 324/248
6,285,186 B1 * 9/2001 Morooka .................... 324/248
6,300,760 B1 * 10/2001 Schubert et al. ............ 324/248

* cited by examiner

Primary Examiner—Edward Lefkowitz
Assistant Examiner—Subhash A Zaveri
(74) Attorney, Agent, or Firm—Adams & Wilks

(57) ABSTRACT

In a superconductive quantum interference element comprising Josephson joints, a washer coil and a detecting coil constituting a superconductive loop and a feedback modulation coil, to provide a superconductive quantum interference element capable of promoting spatial resolution by preventing an effective detection area of the detecting coil from enlarging even when a width of a superconductive wiring constituting the detecting coil and a superconductive film at a vicinity of the detecting coil are larger than an inner diameter of the detecting coil, there is constructed a superconductive quantum interference element having a structure provided with a slit at a detecting coil and/or a superconductive film at a periphery of the detecting coil.

20 Claims, 2 Drawing Sheets

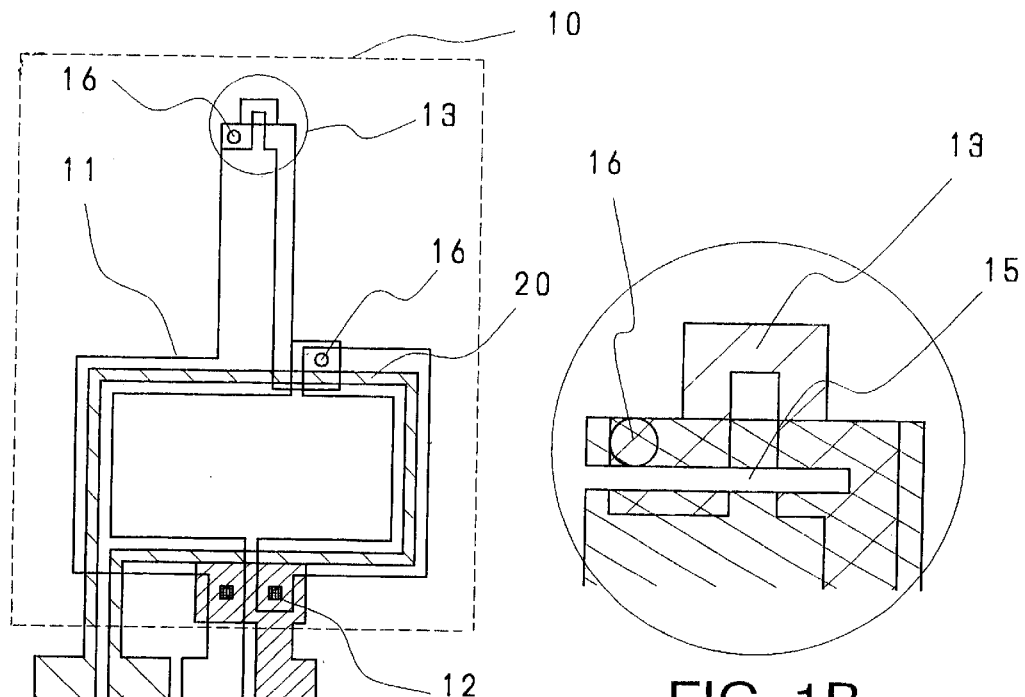
FIG. 1A
FIG. 1B
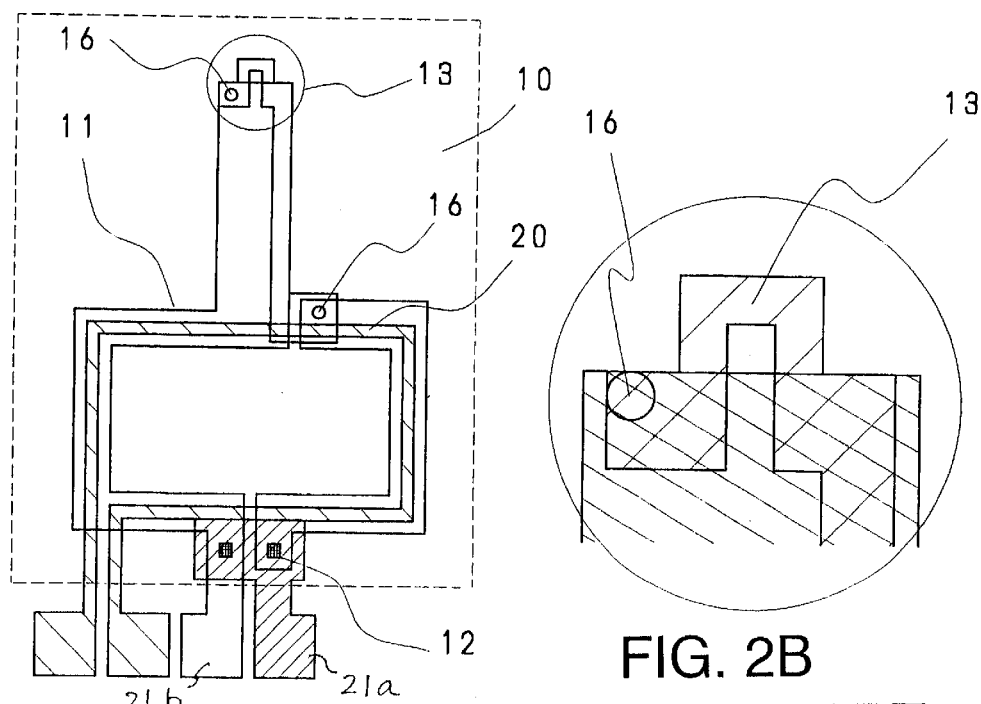
FIG. 2A
PRIOR ART
FIG. 2B
PRIOR ART

SUPERCONDUCTIVE QUANTUM INTERFERENCE ELEMENT

BACKGROUND OF THE INVENTION

1. Field of the Invention

The present invention relates to a magnetism measuring apparatus for measuring or observing an amount of magnetism in a range of a micrometer with regard to a sample comprising a semiconductor element, semiconductor material or superconductive material, or metal material or inorganic material, and more particularly relates to a superconductive quantum interference element (hereinafter, referred to as SQUID) having a high resolution for detecting magnetism.

2. Description of the Related Art

Recently, there has been reduced into practice, a high sensitivity magnetic flux meter having a spatial resolution on the order of a micrometer which is referred to as a SQUID microscope and there has frequently been carried out measurement or observation by using a SQUID microscope with regard to various elements or materials. A SQUID is applied conventionally as a magnetism sensor having a high magnetic field resolution and when a SQUID is used as a SQUID microscope for observing magnetism of a very small region, the spatial resolution becomes an important function.

FIGS. 2A and 2B are on a outline circuit pattern diagram showing an example of conventional SQUID in consideration of spatial resolution, The SQUID is a DC-SQUID fabricated by a superconductive loop 10 and a feedback modulation coil 20. FIG. 3 shows an outline equivalent circuit diagram of the superconductive loop 10 shown in FIG. 2A. The superconductive loop 10 is constituted by a washer coil 11, two Josephson joints or junctions 12 and a detecting coil 13. As shown by FIG. 2A, the superconductive loop 10 is integrated on a silicon substrate along with the feedback modulation coil 20.

As the Josephson joint or junction 12, there is frequently used a tunnel junction type Josephson junction of niobium/aluminum oxide/niobium.

The feedback modulation coil 20 is magnetically coupled with the washer coil 11. Numeral 16 designates a contact hole of the detecting coil 13 and the washer coil 11.

In FIG. 2A and FIG. 3, by an outside control circuit, pertinent bias current is applied between two electrodes 21a and 21b of the washer coil 11 in directions designated in FIG. 3 and magnetic flux having an amount the same as that of magnetic flux detected by the detecting coil 13 and in direction reverse thereto, is fed back to the washer coil 11 via the feedback modulation coil 20 (not illustrated in FIG. 3) overlapping the loop of the washer coil 11 to drive the device. Thereby, the magnetic flux detected by the detecting coil 13 can be provided from the outside control circuit as a voltage output.

The spatial resolution is determined by a shape such as a size of the detecting coil constituting the SQUID and a distance between a sample and the SQUID. When a SQUID having high spatial resolution is designed and fabricated, the SQUID is fabricated by designing an effective detection area of the detecting coil to be as small as possible and utilizing thin film fabricating technology by using photolithography technology.

According to the related art SQUID described above, when the detecting coil is intended to be small in order to promote the spatial resolution, in comparison with an inner diameter of the detecting coil, a width of the detecting coil per se and a superconductive film at a vicinity of the detecting coil are enlarged relatively. As a result, there is a problem in that other than magnetism coupled to the inner diameter portion of the detecting coil, there are detected portions of magnetic flux repelled by the diamagnetism of the detecting coil per se or the superconductive film at a vicinity of the detecting coil and, as a result, an effective area of the detecting coil is enlarged.

SUMMARY OF THE INVENTION

It is an object of the invention to resolve the above-described problem and to provide a SQUID with a reduced effective detection area of a detecting coil and high spatial resolution.

According to the invention, in order to solve the a detecting coil of SQUID showing Embodiment 1 of the invention;

(Second Means)

In addition to the first means, there is used a beam machining apparatus as apparatus of machining the slit.

According to SQUID by the first means, in the magnetic flux repulsed by the detecting coil and/or the superconductive film at the periphery of the detecting coil, a portion of extra magnetic flux which is going to couple with the detecting coil, passes through the slit without being coupled to the detecting coil and therefore, coupling of the extra magnetic flux to the detecting coil is reduced and therefore, the effective detection area of the detecting coil can be reduced and the spatial resolution can be promoted.

By the second means, micromachining of the slit can be carried out and therefore, the function of excluding the extra magnetic flux coupled to the detecting coil can be promoted and the spatial resolution can further be promoted.

BRIEF DESCRIPTION OF THE DRAWINGS

FIG. 1A is an outline view illustrating a total structure of SQUID showing Embodiment 1 of the invention;

FIG. 1B is an outline view illustrating a structure of a detecting coil of SQUID showing Embodiment 1 of the invention FIG. 2A is an outline view showing an example of SQUID in consideration of the related art spatial resolution;

FIG. 2B is an outline view illustrating a structure of a detecting coil of SQUID shown in FIG. 2A;

DESCRIPTION OF THE PREFERRED EMBODIMENTS

Figure 3:
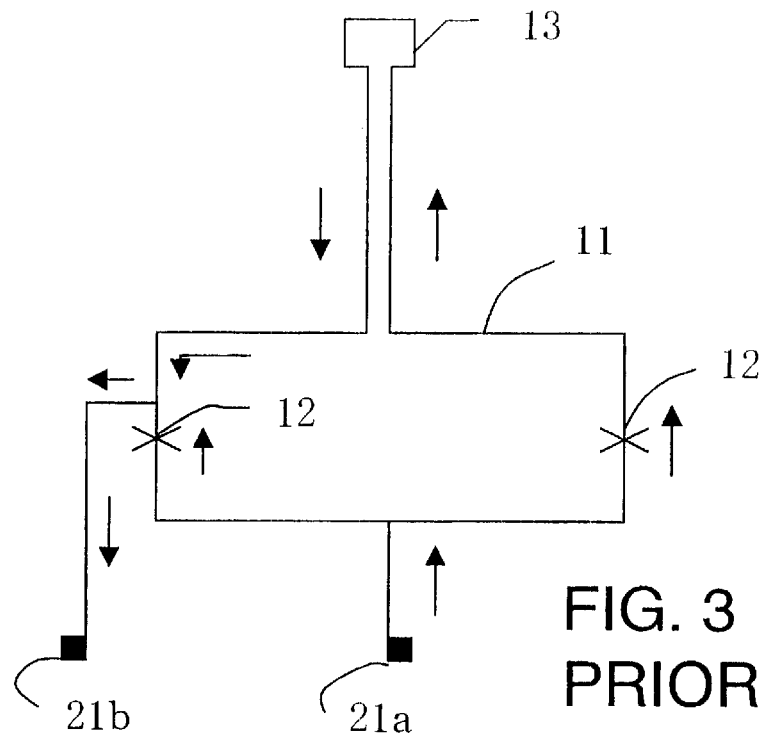
FIG. 3 is an outline equivalent circuit diagram of a superconductive loop for detecting magnetism.

An explanation will be given of embodiments of the invention in reference to the drawings as follows.

(Embodiment 1)

FIGS. 1A and 1B are outline views illustrating a structure of a SQUID showing Embodiment 1 of the invention.

FIG. 1A shows a total structure of the SQUID and FIG. 1B shows a structure of a vicinity of a detecting coil.

Similar to the conventional example, the superconductive loop 10 is constituted by the washer coil 11, the two Josephson joints 12 and the detecting coil 13 and is fabricated on a silicon substrate along with the feedback modulation coil 20.

Thereafter, by using a beam machining apparatus capable of carrying out micromachining, superconductive films at an upper layer and a lower layer are cut in the form a slit 15. The slit 15 is cut in parallel with the inner diameter shape of the detecting coil 13. Although as the beam machining apparatus used for machining the slit 15, there is used a focused ion beam machining apparatus, a different beam machining apparatus such as an excimer laser may be used, and further, the slit 15 may be fabricated by using photolithography.

Figure 4:
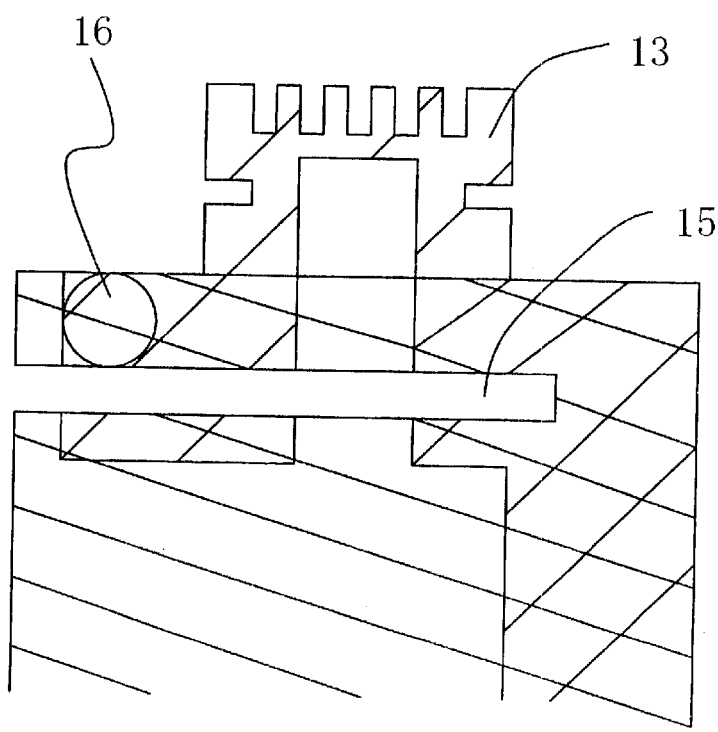
FIG. 4 is an outline view illustrating a structure of a detecting coil of SQUID showing other embodiment of the invention.

When there is present a magnetic field in a direction perpendicular to a film at a periphery of the detecting coil, magnetic flux which is going to intersect with a portion of a superconductive member below the slit 15 in FIG. 1B, is repulsed by the characteristic of the complete dimagnetism of the superconductive member and diverged in a radial shape. There is constructed a structure in which magnetic flux directed in direction of the detecting coil in the diverged magnetic flux, passes through the slit 15 and is drawn to an opposed side of the film. By cutting the slit 15 in parallel with the inner diameter shape of the detecting coil 13 in FIG. 1B, the magnetic flux directed to the detecting coil 13 can be made to pass through further efficiently. Although in FIG. 1B, the slit is provided at the superconductive film at a periphery of the detecting coil, slits may further be provided at the detecting coil per se as shown by FIG. 4. As shown by FIG. 4, the slits in this case may be slits in an orthogonal direction of a coil frame or may be slits in parallel with the coil frame. In either of the cases, these slits serve to pass the magnetic flux directed to the detecting coil in the magnetic flux repulsed by the detecting coil or the superconductive film at the periphery of the detecting coil.

Although fabricated SQUID is of an integrated type fabricated with the detecting coil in a single superconductive loop along with the washer coil and the Josephson joints, there may be constructed a SQUID of a transcoupling type constituting a structure in which the detecting coil is formed by a superconductive loop other than the washer coil and a magnetic field detected by the detecting coil is coupled to the washer coil.

According to the invention, a portion of the magnetic flux repulsed by the diamagnetism of the detecting coil per se or the superconductive film at the vicinity of the detecting coil, passes through the slit and therefore, the portion dose not couple with the detecting coil. As a result, the effective area of the detecting coil can be prevented from enlarging.

What is claimed is:

1. A superconductive quantum interference element fabricated using photolithography technology, comprising: a superconductive loop having a Josephson junction, a washer coil connected to the Josephson junction, and a detecting coil connected to the washer coil; and a feedback modulation coil magnetically coupled to the washer coil; wherein a slit is formed in at least one of the detecting coil and a superconductive film at a periphery of the detecting coil for passing a magnetic flux directed to the detecting coil in a magnetic flux repelled by the superconductive film.

2. A superconductive quantum interference element fabricated using photolithography technology, comprising: a first superconductive loop having a Josephson junction and a washer coil; a second superconductive loop having a detecting coil and an input coil, the second superconductive loop being magnetically coupled to the first superconductive loop; and a feedback modulation coil magnetically coupled to the washer coil; wherein a slit is formed in at least one of the detecting coil and a superconductive film at a periphery of the detecting coil for passing a magnetic flux directed to the detecting coil in a magnetic flux repelled by the superconductive film.

3. The superconductive quantum interference element according to claim 2; wherein the slit is machined by a beam machining apparatus.

4. The superconductive quantum interference element according to claim 1; wherein the slit is machined by a beam machining apparatus.

5. A superconductive quantum interference element according to claim 1; further comprising another Josephson junction connected to the washer coil.

6. A superconductive quantum interference element according to claim 1; wherein the superconductive loop is formed of superconductive thin films on a silicon substrate.

7. A superconductive quantum interference element according to claim 1; wherein the Josephson junction is a tunnel junction type Josephson junction formed of niobium/aluminum oxide/niobium.

8. A superconductive quantum interference element according to claim 1; including means for applying a bias current is applied between the opposite ends of the washer coil so that a magnetic flux equal but opposite to that detected by the detecting coil is fed back to the washer coil by the feedback modulation coil.

9. A superconductive quantum interference element according to claim 1; wherein the slit is formed to be parallel to an inner diameter shape of the detecting coil.

10. A superconductive quantum interference element according to claim 2; further comprising another Josephson junction connected to the washer coil.

11. A superconductive quantum interference element according to claim 2; wherein the first and second superconductive loops are formed of superconductive thin films on a silicon substrate.

12. A superconductive quantum interference element according to claim 2; wherein the Josephson junction is a tunnel junction type Josephson junction formed of niobium/aluminum oxide/niobium.

13. A superconductive quantum interference element according to claim 2; including means for applying a bias current between the opposite ends of the washer coil so that a magnetic flux equal but opposite to that detected by the detecting coil is fed back to the washer coil by the feedback modulation coil.

14. A superconductive quantum interference element according to claim 2; wherein the slit is formed to be parallel to an inner diameter shape of the detecting coil.

15. A SQUID comprising: a superconductive loop formed with superconductive thin films and having a washer coil, a Josephson junction connected to the washer coil, and a detecting coil connected to the washer coil; and a feedback modulation coil magnetically coupled to the washer coil; wherein a slit is formed in at least one of the detecting coil and a superconductive film located at a periphery of the detecting coil for passing a magnetic flux directed to the detecting coil.

16. A SQUID according to claim 15; wherein the superconductive thin films of the superconductive loop and the washer coil are formed on a silicon substrate.

17. A SQUID according to claim 15; wherein the Josephson junction is a tunnel junction type Josephson junction formed of niobium/aluminum oxide/niobium.

18. A SQUID according to claim 15; including means for applying a bias current between the opposite ends of the washer coil so that a magnetic flux equal but opposite to that detected by the detecting coil is fed back to the washer coil by the feedback modulation coil.

19. A SQUID according to claim 15; wherein the slit is formed using a beam machining apparatus.

20. A SQUID according to claim 15; wherein the slit is formed to be parallel to an inner diameter shape of the detecting coil.

* * * * *